US010373590B2

(12) United States Patent
Mourou et al.

(10) Patent No.: US 10,373,590 B2
(45) Date of Patent: Aug. 6, 2019

(54) SELECTIVE POINT OF VIEW IMAGING DISPLAY SYSTEM (71) Applicant: GM GLOBAL TECHNOLOGY OPERATIONS LLC, Detroit, MI (US)

(72) Inventors: Julien P. Mourou, Bloomfield Hills, MI (US); Eric S. Nielsen, Sterling Heights, MI (US); James A. Carpenter, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 162 days.

(21) Appl. No.: 15/490,004

(22) Filed: Apr. 18, 2017

(65) Prior Publication Data

US 2018/0301117 A1 Oct. 18, 2018

(51) Int. Cl.
*G09G 5/14* (2006.01)
*G06F 3/147* (2006.01)
(Continued)

(52) U.S. Cl.
CPC ............... *G09G 5/14* (2013.01); *B60K 35/00* (2013.01); *G06F 3/147* (2013.01); *G06F 3/1423* (2013.01); *G09G 5/003* (2013.01); *B60K 2370/1526* (2019.05); *B60K 2370/20* (2019.05); *B60K 2370/27* (2019.05); *B60K 2370/52* (2019.05); *G02F 1/133512* (2013.01); *G02F 1/133617* (2013.01); *G02F 2001/133342* (2013.01); *G02F 2001/133562* (2013.01); *G02F 2001/133567* (2013.01); *G02F 2001/133614* (2013.01); *G02F 2201/44* (2013.01); *G09G 2300/023* (2013.01); *G09G 2354/00* (2013.01); *G09G 2380/10* (2013.01); *H01L 25/0753* (2013.01);
(Continued)

(58) Field of Classification Search
CPC ............... B60K 35/00; B60K 2350/20; B60K 2350/2095; B60K 2350/352; G02F 1/133512; G02F 1/133617; G02F 2001/133342; G02F 2001/133562; G02F 2001/133567; G02F 2001/133614; G02F 2201/44; G09G 5/0003; G09G 5/14; G09G 2380/10; H01L 25/0753; H01L 25/167; H01L 27/3232; H01L 27/3267; H01L 27/3286; H01L 33/501; H01L 33/58; H01L 51/5284
See application file for complete search history.

(56) References Cited

U.S. PATENT DOCUMENTS

4,678,285 A * 7/1987 Ohta ................. G02F 1/133603
348/E3.015
5,040,098 A * 8/1991 Tanaka .................... G02B 6/002
362/23.15
(Continued)

*Primary Examiner* — Mihir K Rayan (57) ABSTRACT

An automotive vehicle includes a cabin, a controller, and a multi-view display. The multi-view display has a first side facing the cabin and a second side facing the exterior of the vehicle. The multi-view display has a first-side display screen, a second-side display screen, and a blocking layer disposed between the first-side display screen and the second-side display screen. The first-side display screen and the second-side display screen are in communication with the controller and operable to display a first pattern on the first-side display screen and a second pattern, distinct from the first pattern, on the second-side display screen.

12 Claims, 4 Drawing Sheets (51) Int. Cl.
*G02F 1/1335* (2006.01)
*G02F 1/1333* (2006.01)
*H01L 25/075* (2006.01)
*H01L 27/32* (2006.01)
*H01L 51/52* (2006.01)
*B60K 35/00* (2006.01)
*G09G 5/00* (2006.01)
*G06F 3/14* (2006.01)
*H01L 25/16* (2006.01)
*H01L 33/50* (2010.01)
*H01L 33/58* (2010.01)

(52) U.S. Cl.
CPC ........ *H01L 25/167* (2013.01); *H01L 27/3232* (2013.01); *H01L 27/3267* (2013.01); *H01L 27/3286* (2013.01); *H01L 33/501* (2013.01); *H01L 33/58* (2013.01); *H01L 51/5284* (2013.01)

(56) References Cited

U.S. PATENT DOCUMENTS

| | | | | |
|---|---|---|---|---|
| 5,124,845 A | * | 6/1992 | Shimojo | B60Q 1/2665 345/59 |
| 5,896,575 A | * | 4/1999 | Higginbotham | G06F 1/16 455/557 |
| 6,335,681 B1 | * | 1/2002 | Ontiveros | B60K 31/18 340/457 |
| 6,446,375 B1 | * | 9/2002 | Davis | G09F 3/20 40/591 |
| 6,578,985 B1 | * | 6/2003 | Seraphim | G02F 1/133604 362/243 |
| 6,871,975 B2 | * | 3/2005 | Chuang | G02B 6/0046 362/23.1 |
| 2003/0234724 A1 | * | 12/2003 | Chiu | B60Q 1/34 340/464 |
| 2005/0024293 A1 | * | 2/2005 | Sakata | H01L 51/5262 345/30 |
| 2005/0052348 A1 | * | 3/2005 | Yamazaki | B60W 30/095 345/44 |
| 2005/0248503 A1 | * | 11/2005 | Schobben | B60K 35/00 345/7 |
| 2008/0136911 A1 | * | 6/2008 | Shaffer | H04N 7/181 348/148 |
| 2012/0089273 A1 | * | 4/2012 | Seder | B60Q 1/268 701/2 |
| 2014/0055831 A1 | * | 2/2014 | Johnson | E06B 9/24 359/238 |
| 2017/0153379 A1 | * | 6/2017 | Chang | G02B 6/0081 |

* cited by examiner

SELECTIVE POINT OF VIEW IMAGING DISPLAY SYSTEM

TECHNICAL FIELD

The present disclosure relates to vehicles controlled by automated driving systems, particularly those configured to automatically control vehicle steering, acceleration, and braking during a drive cycle without human intervention.

INTRODUCTION

The operation of modern vehicles is becoming more automated, i.e. able to provide driving control with less and less driver intervention. Vehicle automation has been categorized into numerical levels ranging from Zero, corresponding to no automation with full human control, to Five, corresponding to full automation with no human control. Various automated driver-assistance systems, such as cruise control, adaptive cruise control, and parking assistance systems correspond to lower automation levels, while true "driverless" vehicles correspond to higher automation levels.

SUMMARY

An automotive vehicle according to the present disclosure includes a cabin, a controller, and a multi-view display. The multi-view display has a first side facing the cabin and a second side facing the exterior of the vehicle. The multi-view display has a first-side display screen, a second-side display screen, and a blocking layer disposed between the first-side display screen and the second-side display screen. The first-side display screen and the second-side display screen are in communication with the controller and operable to display a first pattern on the first-side display screen and a second pattern, distinct from the first pattern, on the second-side display screen.

In an exemplary embodiment, the multi-view display additionally includes a first-side rigid layer disposed on the cabin side of the first-side display screen and a second-side rigid layer disposed on the exterior side of the second-side display screen. In such embodiments, the first-side rigid layer may be at least 70% transparent and the second-side rigid layer may be at least 70% transparent.

In an exemplary embodiment, the first-side display screen includes a first polymer film provided with fluorescent material, and the second-side display screen includes a second polymer film provided with fluorescent material. In such embodiments, the multi-view display includes a first energy source configured to emit energy to a portion of the first polymer film and a second energy source configured to emit energy to a portion of the second polymer film. The first polymer film may include polyvinyl butyral and the second polymer film may include polyvinyl butyral. The first polymer film may include a first layer for emission of a first color of the visible spectrum and a second layer for emission of a second color of the visible spectrum. Additional layers may be provided for emission of additional colors of the visible spectrum.

In an exemplary embodiment, the blocking layer is configured to selectively inhibit energy transmission from the first side to the second side.

A method of displaying a pattern according to the present disclosure includes providing a multi-view display. The multi-view display has a plurality of laminated layers including a first polymer film with fluorescent material, a second polymer film with fluorescent material, and an ultraviolet-blocking layer disposed between the first polymer film and the second polymer film. The method additionally includes providing a first ultraviolet energy source and providing a second ultraviolet energy source. The method further includes generating a first pattern by emission of energy from the first source to a portion of the first polymer film, and generating a second pattern by emission of energy from the second source to a portion of the second polymer film.

In an exemplary embodiment, the second pattern is distinct from the first pattern.

In an exemplary embodiment, the plurality of laminated layers includes a first rigid layer disposed on a first side of the first polymer film and a second rigid layer on a second side of the second polymer film.

In an exemplary embodiment, the first polymer film includes a first layer for emission of a first color of the visible spectrum and a second layer for emission of a second color of the visible spectrum. Additional layers may be provided for emission of additional colors of the visible spectrum.

In an exemplary embodiment, the method additionally includes assembling the multi-view display to an automotive vehicle with the first polymer film oriented toward an interior of the vehicle and the second polymer film oriented toward an exterior of the vehicle.

A display assembly according to the present disclosure includes a blocking layer having a first side and a second side. A first rigid layer is disposed proximate the first side and coupled directly or indirectly to the blocking layer, and a second rigid layer disposed proximate the second side and coupled directly or indirectly to the blocking layer. A first cavity is disposed between the blocking layer and the first rigid layer, and a second cavity is disposed between the blocking layer and the second rigid layer. A first display screen is disposed between the blocking layer and the first rigid layer, and a second display screen is disposed between the blocking layer and the second rigid layer. A controller is configured to simultaneously display a first pattern on the first display screen and a second pattern, distinct from the first pattern, on the second display screen.

Embodiments according to the present disclosure provide a number of advantages. For example, the present disclosure provides a system and method for simultaneous display of a first image in an interior of a vehicle and a second distinct image on an exterior of the vehicle.

The above and other advantages and features of the present disclosure will be apparent from the following detailed description of the preferred embodiments when taken in connection with the accompanying drawings.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
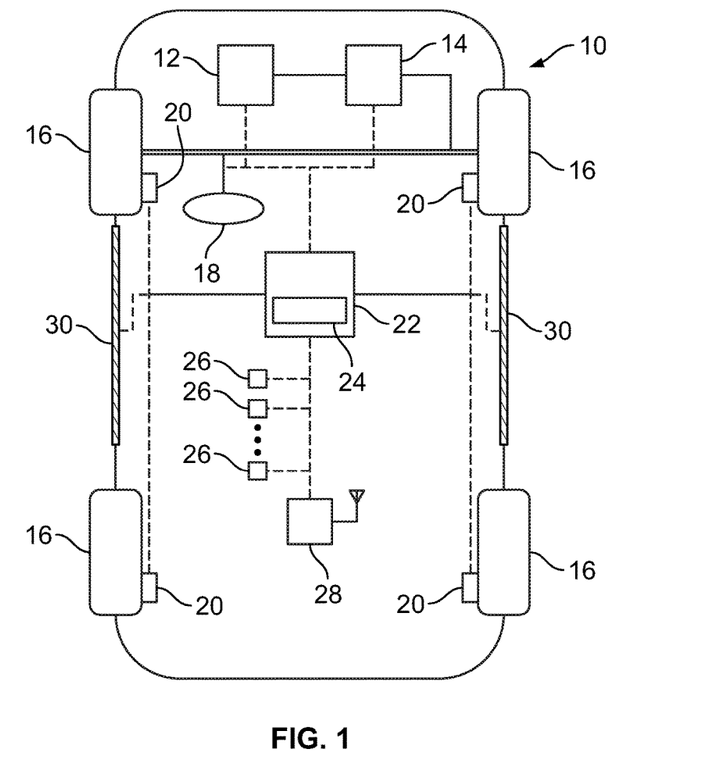
FIG. 1 is a schematic view of a vehicle according to the present disclosure.

Referring now to FIG. 1, an automotive vehicle 10 according to the present disclosure is shown in schematic form. The automotive vehicle 10 includes a propulsion system 12, which may in various embodiments include an internal combustion engine, an electric machine such as a traction motor, and/or a fuel cell propulsion system.

The automotive vehicle 10 also includes a transmission 14 configured to transmit power from the propulsion system 12 to vehicle wheels 16 according to selectable speed ratios. According to various embodiments, the transmission 14 may include a step-ratio automatic transmission, a continuously-variable transmission, or other appropriate transmission.

The automotive vehicle 10 additionally includes a steering system 18. While depicted as including a steering wheel for illustrative purposes, in some embodiments contemplated within the scope of the present disclosure, the steering system 18 may not include a steering wheel.

The automotive vehicle 10 additionally includes a plurality of vehicle wheels 16 and associated wheel brakes 20 configured to provide braking torque to the vehicle wheels 16. The wheel brakes 20 may, in various embodiments, include friction brakes, a regenerative braking system such as an electric machine, and/or other appropriate braking systems.

The propulsion system 12, transmission 14, steering system 18, and wheel brakes 20 are in communication with or under the control of at least one controller 22. While depicted as a single unit for illustrative purposes, the controller 22 may additionally include one or more other controllers, collectively referred to as a "controller." The controller 22 may include a microprocessor or central processing unit (CPU) in communication with various types of computer readable storage devices or media. Computer readable storage devices or media may include volatile and nonvolatile storage in read-only memory (ROM), random-access memory (RAM), and keep-alive memory (KAM), for example. KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller 22 in controlling the vehicle.

The controller 22 is provided with an automated driving system (ADS) 24 for automatically controlling various actuators in the vehicle 10. In an exemplary embodiment, the ADS 24 is configured to control the propulsion system 12, transmission 14, steering system 18, and wheel brakes 20 to control vehicle acceleration, steering, and braking, respectively, without human intervention.

The ADS 24 is configured to control the propulsion system 12, transmission 14, steering system 18, and wheel brakes 20 in response to inputs from a plurality of sensors 26, which may include GPS, RADAR, LIDAR, optical cameras, thermal cameras, ultrasonic sensors, and/or additional sensors as appropriate.

The vehicle 10 additionally includes a wireless communications system 28 configured to wirelessly communicate with other vehicles ("V2V") and/or infrastructure ("V2I"). In an exemplary embodiment, the wireless communication system 28 is configured to communicate via a dedicated short-range communications (DSRC) channel. DSRC channels refer to one-way or two-way short-range to medium-range wireless communication channels specifically designed for automotive use and a corresponding set of protocols and standards. However, additional or alternate wireless communications standards, such as IEEE 802.11 and cellular data communication, are also considered within the scope of the present disclosure.

In an exemplary embodiment, the ADS 24 is a so-called Level Four or Level Five automation system. A Level Four system indicates "high automation", referring to the driving mode-specific performance by an automated driving system of all aspects of the dynamic driving task, even if a human driver does not respond appropriately to a request to intervene. A Level Five system indicates "full automation", referring to the full-time performance by an automated driving system of all aspects of the dynamic driving task under all roadway and environmental conditions that can be managed by a human driver.

The vehicle 10 additionally includes at least one multi-view display 30, which will be discussed in further detail below. In the embodiment of FIG. 1, the vehicle 10 includes multi-view displays 30 on sides of the vehicle 10, e.g. in locations generally corresponding to traditional side windows. However, in other embodiments, different numbers of multi-view displays 30 may be included. Multi-view displays 30 may also be provided in different vehicle locations, such as at a front portion of the vehicle 10 corresponding to a traditional windshield, a rear portion of the vehicle 10 corresponding to a traditional rear window, a top portion of the vehicle 10 corresponding to a traditional sunroof, or any other location of the vehicle. The multi-view display or displays 30 are in communication with or under the control of the controller 22.

When a vehicle with an automated driving system is operated in an autonomous mode of operation, occupants in the vehicle may desire to view images, videos, text, or other visual patterns rather than viewing the outside of the vehicle.

Figure 2:
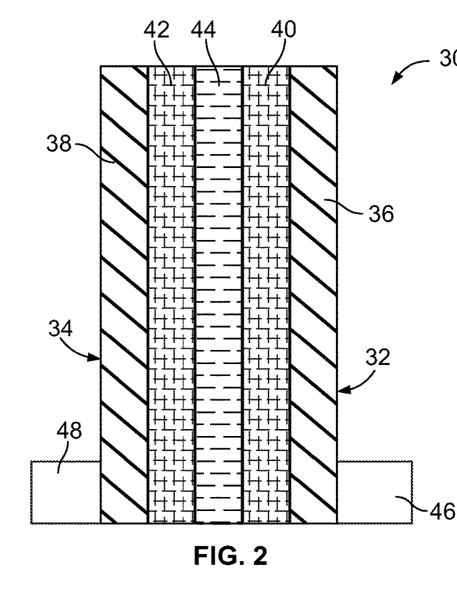
FIG. 2 is a schematic representation of a first embodiment of a laminated display assembly according to the present disclosure.

Referring now to FIG. 2, a multi-view display 30' is shown. The multi-view display 30' includes a plurality of laminated layers as will be discussed in further detail below.

The multi-view display 30' may be implemented in a vehicle in similar fashion as the multi-view display 30 depicted in FIG. 1.

The multi-view display 30' has a first side 32 and a second side 34. In an exemplary embodiment, the first side 32 faces an interior portion of a vehicle, which may be referred to as a cabin, while the second side 34 faces an exterior of the vehicle. The multi-view display 30' has a first imaging display surface visible on the first side 32 and a second imaging display surface visible on the second side 34.

The multi-view display 30' includes a first rigid layer 36 on the first side 32 and a second rigid layer 38 on the second side 34. The rigid layers 36 and 38 may, in various embodiments, include tempered glass, polycarbonate, or other rigid materials having desirable light transmissive properties. In automotive implementations the rigid layers 36 and 38 may be at least 70% transparent; however, in other implementations other light transmissive ranges may be desirable.

The multi-view display 30' also includes a first display interlayer 40 proximate the first rigid layer 36, a second display interlayer 42 proximate the second rigid layer 38, and a blocking interlayer 44 disposed between the first display interlayer 40 and the second display interlayer 42. A first energy source 46 is provided on the first side 32 and a second energy source 48 is provided on the second side 34. In an exemplary embodiment, the first energy source 46 includes a first ultraviolet laser and the second energy source 48 includes a second ultraviolet laser.

The first and second display interlayers 40 and 42 may each comprise one or more respective layers of polymer film provided with a fluorescent material. The polymer film may be, for example, polyvinyl butyral ("PVB"), while the fluorescent material may be, for example, a phosphor. In response to ultraviolet radiation, the fluorescent material emits light in the visible spectrum. The first energy source 46 may be controlled to emit ultraviolet radiation to one or more discrete portions of the first display interlayer 40, such that fluorescent material in the one or more discrete portions emits light to form a pattern. Likewise, the second energy source 48 may be controlled to emit ultraviolet radiation to one or more discrete portions of the second display interlayer 42, such that fluorescent material in the one or more discrete portions emits light to form a pattern.

The first display interlayer 40 may include multiple layers of polymer film, each layer having respective fluorescent materials which emit different colors of visible light, e.g. red, blue, and green. In such an embodiment, the first energy source 46 may be controlled to selectively emit radiation to respective layers of polymer film in the first display interlayer 40 to form a composite pattern comprising multiple colors of visible light, e.g. by varying wavelength of the first energy source 46. The second display interlayer 42 may similarly include multiple layers of polymer film, and the second energy source 48 may be similarly controlled to form a composite pattern comprising multiple colors of visible light on the second display interlayer 42.

The first energy source 46 may be controlled to generate a first pattern on the first display interlayer 40 and the second energy source 48 may be controlled to generate a second pattern on the second display interlayer 42. The first pattern may include an image, text, video, icon, combination thereof, or any other desired pattern. The second pattern may similarly include an image, text, video, icon, combination thereof, or any other desired pattern. The first energy source 46 may be controlled independently from the second energy source 46 to produce a first pattern different from the second pattern, such that a viewer observing the first side 32 perceives a different pattern from a viewer observing the second side 34.

In an alternative embodiment, the first display interlayer 40 includes a first transparent LCD display, with a first light cavity disposed between the first transparent LCD display and the blocking interlayer 44, and the second display interlayer 42 includes a second transparent LCD display, with a second light cavity disposed between the second transparent LCD display and the blocking interlayer 44. The first energy source 46 may be controlled to provide light to the first light cavity, and the second energy source 48 may be controlled to provide light to the second light cavity. In such embodiments, the first transparent LCD display may be controlled to generate a first pattern and the second transparent LCD display may be controlled to generate a second pattern, distinct from the first pattern.

In other embodiments, the first display interlayer 40 and second display interlayer 42 may include other display technologies as appropriate. In some embodiments, the first display interlayer 40 includes a first display technology and the second display interlayer 42 includes a second display technology, different from the first display technology. Viewing experiences may thereby be optimized for viewers on different sides of the multi-view display 30'.

The blocking layer 44 is configured to inhibit energy transmission from the first display interlayer 40 to the second display interlayer 42. In an exemplary embodiment, the blocking layer 44 is formed of an ultraviolet-blocking material such that it blocks energy transmission under all operating conditions. In alternative embodiments, the blocking layer 44 is configured to selectively inhibit energy transmission. In such embodiments, the blocking layer 44 may include an LCD shutter, microshutters, an electrochromic film, an electrophoretic display, a suspended particle device, or other appropriate mechanisms for selectively inhibiting transmission of energy from the first display interlayer 40 to the second display interlayer 42.

Figure 3:
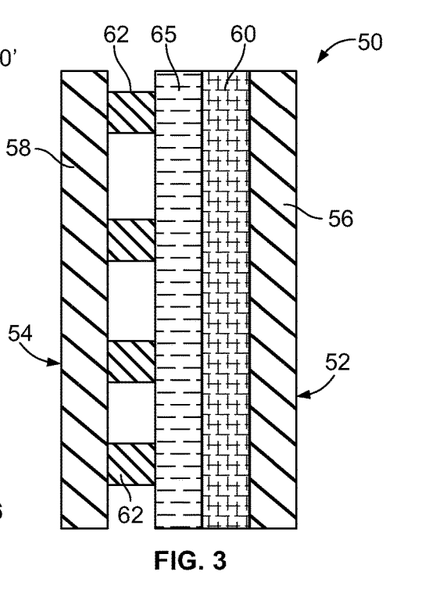
FIG. 3 is a schematic representation of a second embodiment of a laminated display assembly according to the present disclosure.

Referring now to FIG. 3, an exemplary embodiment of a multi-view display 50 having differing display technologies is illustrated. The multi-view display 50 has a first side 52 and a second side 54. In an exemplary embodiment, the first side 52 faces an interior portion of a vehicle, which may be referred to as a cabin, while the second side 54 faces an exterior of the vehicle. The multi-view display 50 has a first imaging display surface visible on the first side 52 and a second imaging display surface visible on the second side 54.

The multi-view display 50 includes a first rigid layer 56 on the first side 52 and a second rigid layer 58 on the second side 54, which may be generally similar to the rigid layers 36 and 38 illustrated in FIG. 2. The multi-view display 50 also includes a first display interlayer 60 proximate the first rigid layer 56, a second display interlayer 62 proximate the second rigid layer 58, and a blocking interlayer 64 disposed between the first display interlayer 60 and the second display interlayer 62. The first display interlayer 60 includes a transparent OLED display, and the second display interlayer 62 includes an array of unidirectional LEDs defining a dot matrix display visible from the second side 54. The first display interlayer 60 and second display interlayer 62 may be independently controlled to generate a first pattern on the first display interlayer 60 and a second pattern on the second display interlayer 62, generally as described above with respect to FIG. 2.

Advantageously, in such an embodiment, the first display interlayer 40 may provide a high quality viewing experience for an occupant of a vehicle, while the second display interlayer 42 may provide a bright and easily visible display on the exterior of the vehicle.

Figure 4:
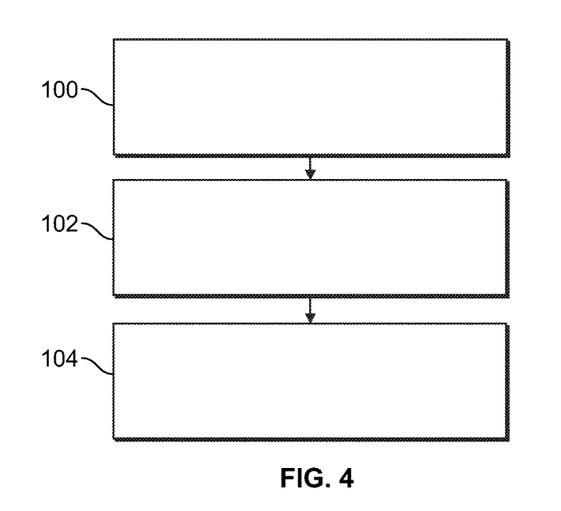
FIG. 4 is a flowchart representation of a method according to the present disclosure.

Referring now to FIG. 4, a method according to the present disclosure is illustrated in flowchart form. A multi-view display is provided, as illustrated at block 100. The multi-view display includes a first rigid layer, first polymer film, a blocking layer, a second polymer film, and a second rigid layer. A first UV energy source and a second UV energy source are provided, as illustrated at block 102. A first pattern is generated on the first film and a second pattern is generated on the second film, as illustrated at block 104. The first pattern and second pattern may be distinct.

Referring to FIGS. 5-11, various alternative embodiments of displays are illustrated schematically.

Figure 5:
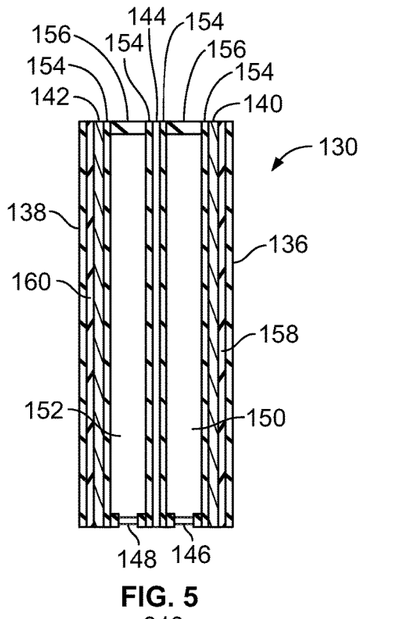
FIGS. 5-11 are schematic representations of alternative embodiments of display assemblies according to the present disclosure.

Referring to FIG. 5, a multi-view display 130 includes a first rigid layer 136, a second rigid layer 138, a first display interlayer 140, a second display interlayer 142, and a central blocking layer 144, which are generally similar to the rigid layers 36 and 38, the display interlayers 40 and 42, and the blocking layer 44 discussed above with respect to FIG. 2. In addition, the multi-view display 130 includes a first cavity 150 disposed between the blocking layer 144 and the first display interlayer 140, and a second cavity 152 disposed between the blocking layer 144 and the second display interlayer 142. The cavities 150 and 152 are defined by additional rigid layers 154 separated by spacers 156. The cavities 150 and 152 may be filled with a gas such as argon or Krypton, or may comprise a vacuum. A first ultraviolet energy source 146 is provided proximate the cavity 150, and a second ultraviolet energy source 148 is provided proximate the cavity 152. The energy sources 146 and 148 are arranged to provide ultraviolet energy to the display interlayers 140 and 142 respectively, in a generally similar fashion as the energy sources 46 and 48 discussed above with respect to FIG. 2. A first ultraviolet cut-off layer 158 is disposed between the first display interlayer 140 and the first rigid layer 136, and a second ultraviolet cut-off layer 160 is disposed between the second display interlayer 142 and the second rigid layer 138. The ultraviolet cut-off layers 158 and 160 are provided to inhibit leakage of ultraviolet light from the energy sources 46 and 48 to the exterior of the assembly. The ultraviolet cut-off layers 158 and 160 may comprise, for example, PVB. The embodiment of FIG. 4 may provide desirable insulative properties, similar to a triple pane window.

Figure 6:
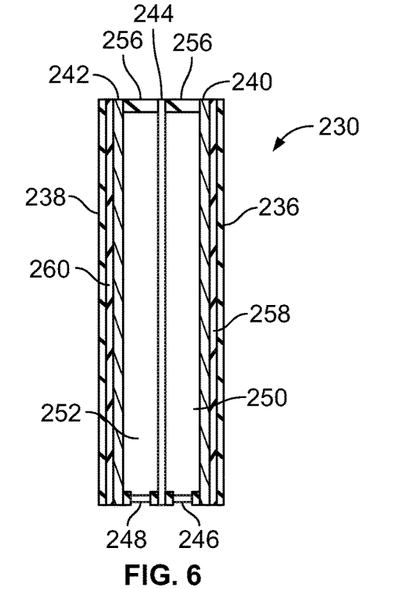

Referring to FIG. 6, a multi-view display 230 includes a first rigid layer 236, a second rigid layer 238, a first display interlayer 240, a second display interlayer 242, and a central blocking layer 244, which are generally similar to the rigid layers 36 and 38, the display interlayers 40 and 42, and the blocking layer 44 discussed above with respect to FIG. 2. A first cavity 250 is disposed between the blocking layer 244 and the first display interlayer 240, and a second cavity 252 is disposed between the blocking layer 244 and the second display interlayer 242. The first cavity 250 is defined by the blocking layer 244 and the first display interlayer 240, separated by a spacer 256, while the second cavity 252 is defined by the blocking layer 244 and the second display interlayer 242, separated by a spacer 256. As with the embodiment of FIG. 4, the cavities 250 and 252 may be filled with a gas or may comprise a vacuum. Energy sources 246 and 248 are arranged to provide ultraviolet energy to the display interlayers 240 and 242 respectively, in a generally similar fashion as the energy sources 146 and 148 discussed above with respect to FIG. 4. A first ultraviolet cut-off layer 258 is disposed between the first display interlayer 240 and the first rigid layer 236, and a second ultraviolet cut-off layer 260 is disposed between the second display interlayer 242 and the second rigid layer 238.

Figure 7:
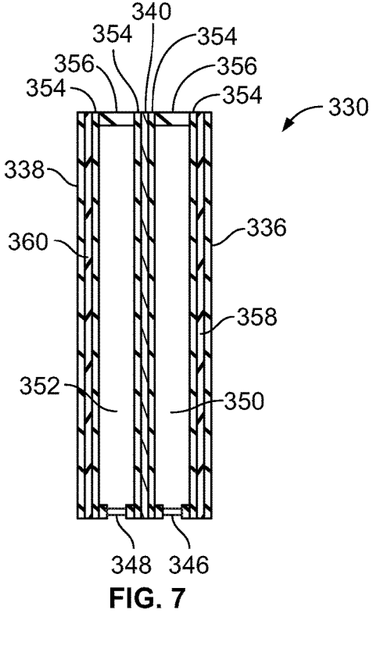

Referring to FIG. 7, a display 330 includes a first rigid layer 336, a second rigid layer 338, and a central display interlayer 340, which are generally similar to the rigid layers 36 and 38 and the display interlayer 40 discussed above with respect to FIG. 2. In addition, the display 330 includes a first cavity 350 disposed between the display interlayer 340 and a first ultraviolet cut-off layer 358, and a second cavity 352 disposed between the display interlayer 340 and a second ultraviolet cut-off layer 360. The cavities 350 and 352 are defined by additional rigid layers 354 separated by spacers 356. A first ultraviolet energy source 346 is provided proximate the cavity 350, and a second ultraviolet energy source 348 is provided proximate the cavity 352. The energy sources 346 and 348 are arranged to provide ultraviolet energy to the display interlayer 340 in a generally similar fashion as the energy sources 46 and 48 discussed above with respect to FIG. 2. In this embodiment, any images generated on the display interlayer 340 will be visible from both sides of the display 330.

Figure 8:
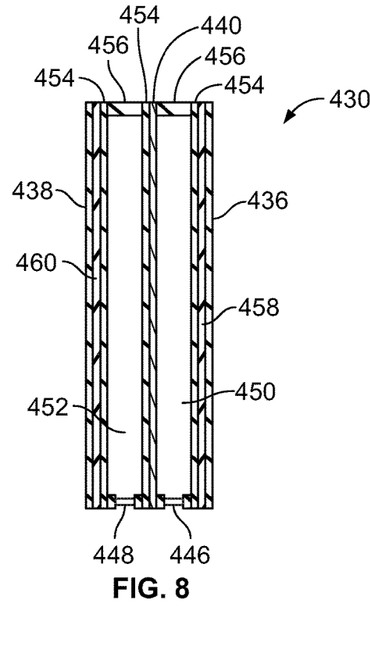

Referring to FIG. 8, a display 430 includes a first rigid layer 436, a second rigid layer 438, and a central display interlayer 440, which are generally similar to the rigid layers 36 and 38 and the display interlayer 40 discussed above with respect to FIG. 2. In addition, the display 430 includes a first cavity 450 disposed between the display interlayer 440 and a first ultraviolet cut-off layer 458, and a second cavity 452 disposed between the display interlayer 440 and a second ultraviolet cut-off layer 460. The cavities 450 is defined by the display interlayer 440 and a rigid layer 454, separated by a spacer 456, and the cavity 452 is defined by additional rigid layers 454 separated by a spacer 456. A first ultraviolet energy source 446 is provided proximate the cavity 450, and a second ultraviolet energy source 448 is provided proximate the cavity 452. The energy sources 446 and 448 are arranged to provide ultraviolet energy to the display interlayer 440 in a generally similar fashion as the energy sources 46 and 48 discussed above with respect to FIG. 2. In this embodiment, any images generated on the display interlayer 440 will be visible from both sides of the display 430.

Figure 9:
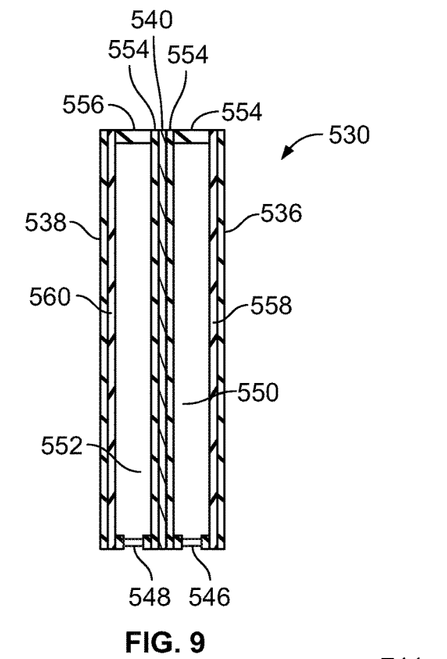

Referring to FIG. 9, a display 530 includes a first rigid layer 536, a second rigid layer 538, and a central display interlayer 540, which are generally similar to the rigid layers 36 and 38 and the display interlayer 40 discussed above with respect to FIG. 2. In addition, the display 530 includes a first cavity 550 disposed between the display interlayer 540 and a first ultraviolet cut-off layer 558, and a second cavity 552 disposed between the display interlayer 540 and a second ultraviolet cut-off layer 560. The first cavity 550 is defined by a rigid layer 554 and the first ultraviolet cut-off layer 558, separated by a spacer 556, and the second cavity 552 is defined by an additional rigid layer 554 and the second ultraviolet layer 560, separated by a spacer 456. A first ultraviolet energy source 546 is provided proximate the cavity 550, and a second ultraviolet energy source 548 is provided proximate the cavity 552. The energy sources 546 and 548 are arranged to provide ultraviolet energy to the display interlayer 540 in a generally similar fashion as the energy sources 46 and 48 discussed above with respect to FIG. 2. In this embodiment, any images generated on the display interlayer 540 will be visible from both sides of the display 530.

Figure 10:
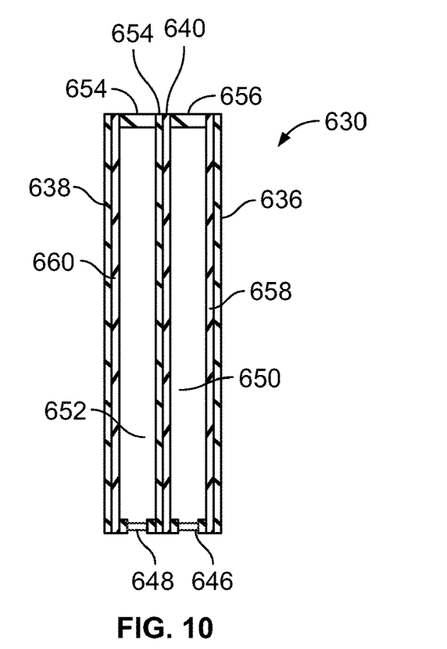

Referring to FIG. 10, a display 630 includes a first rigid layer 636, a second rigid layer 638, and a central display interlayer 640, which are generally similar to the rigid layers 36 and 38 and the display interlayer 40 discussed above with respect to FIG. 2. In addition, the display 630 includes a first cavity 650 disposed between the display interlayer 640 and a first ultraviolet cut-off layer 658, and a second cavity 652 disposed between the display interlayer 640 and a second ultraviolet cut-off layer 660. The first cavity 650 is defined by the display interlayer 640 and the first ultraviolet cut-off layer 658, separated by a spacer 656, and the second cavity 652 is defined by a rigid layer 654 and the second ultraviolet layer 660, separated by a spacer 656. A first ultraviolet energy source 646 is provided proximate the cavity 650, and a second ultraviolet energy source 648 is provided proximate the cavity 652. The energy sources 646 and 648 are arranged to provide ultraviolet energy to the display interlayer 640 in a generally similar fashion as the energy sources 46 and 48 discussed above with respect to FIG. 2. In this embodiment, any images generated on the display interlayer 640 will be visible from both sides of the display 630.

Figure 11:
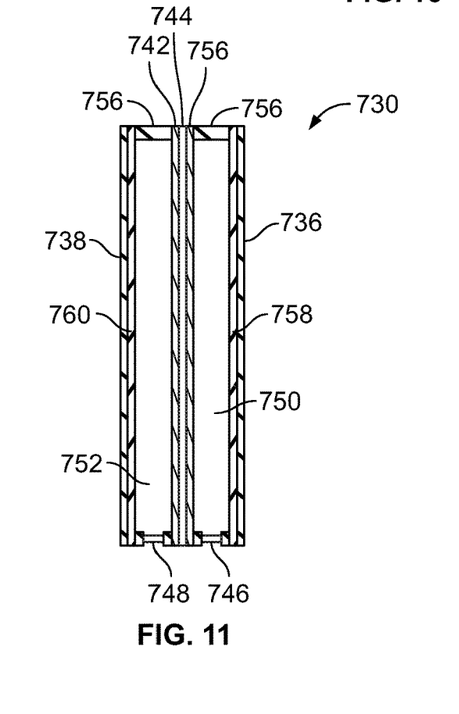

Referring to FIG. 11, a display 730 includes a first rigid layer 736, a second rigid layer 738, a first display interlayer 740, a second display interlayer 742, and a central blocking layer 744, which are generally similar to the rigid layers 36 and 38, the display interlayers 40 and 42, and the blocking layer 44 discussed above with respect to FIG. 2. In addition, the display 730 includes a first cavity 750 disposed between the first display interlayer 740 and a first ultraviolet cut-off layer 758, and a second cavity 752 disposed between the second display interlayer 742 and a second ultraviolet cut-off layer 760. The first cavity 750 is defined by the first display interlayer 740 and the first ultraviolet cut-off layer 758, separated by a spacer 756, and the second cavity 752 is defined by the second display interlayer 742 and the second ultraviolet layer 760, separated by a spacer 756. A first ultraviolet energy source 746 is provided proximate the cavity 750, and a second ultraviolet energy source 748 is provided proximate the cavity 752. The energy sources 746 and 748 are arranged to provide ultraviolet energy to the display interlayers 740 and 742, respectively, in a generally similar fashion as the energy sources 46 and 48 discussed above with respect to FIG. 2.

As may be seen, the present disclosure provides a system and method for presenting differing patterns on opposing sides of a display, which may be provided on a vehicle. A first image may be thereby viewed by an occupant within the vehicle, while a different image may be viewed by an observer outside of the vehicle.

While the embodiments of FIGS. 1-11 are generally discussed in conjunction with autonomous automotive vehicles, one of ordinary skill in the art will appreciate that embodiments according to the present disclosure may be implemented in conventional automotive vehicles, or in nonautomotive fields. As non-limiting examples, a multi-view display may be provided as an advertising display capable of displaying differing advertisements on different sides, or as a bus stop display capable of displaying messaging pertinent to passengers on an interior side and an advertisement on an exterior side.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further exemplary aspects of the present disclosure that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. An automotive vehicle comprising:
a cabin;
a controller; and
a multi-view display with a first side facing the cabin and a second side facing the exterior of the vehicle, the multi-view display having a first-side display screen, a second-side display screen, and a blocking layer disposed between the first-side display screen and the second-side display screen, the first-side display screen and the second-side display screen being in communication with the controller and operable to display a first pattern on the first-side display screen and a second pattern, distinct from the first pattern, on the second-side display screen.

2. The automotive vehicle of claim 1, wherein the multi-view display additionally includes a first-side rigid layer disposed on the cabin side of the first-side display screen, and a second-side rigid layer disposed on the exterior side of the second-side display screen.

3. The automotive vehicle of claim 2, wherein the first-side rigid layer is at least 70% transparent and the second-side rigid layer is at least 70% transparent.

4. The automotive vehicle of claim 1, wherein the first-side display screen includes a first polymer film provided with fluorescent material, the second-side display screen includes a second polymer film provided with fluorescent material, and the multi-view display includes a first energy source configured to emit energy to a portion of the first polymer film and a second energy source configured to emit energy to a portion of the second polymer film.

5. The automotive vehicle of claim 4, wherein the first polymer film comprises polyvinyl butyral and the second polymer film comprises polyvinyl butyral.

6. The automotive vehicle of claim 4, wherein the first polymer film includes a first layer for emission of a first color of the visible spectrum and a second layer for emission of a second color of the visible spectrum.

7. The automotive vehicle of claim 1, wherein the first-side display screen includes a transparent OLED display, and the second-side display screen includes an array of unidirectional LEDs.

8. The automotive vehicle of claim 1, wherein the blocking layer is configured to selectively inhibit energy transmission from the first side to the second side.

9. A method of displaying a pattern comprising:
providing a multi-view display having plurality of laminated layers including a first polymer film with fluorescent material, a second polymer film with fluorescent material, and an ultraviolet-blocking layer disposed between the first polymer film and the second polymer film;

assembling the multi-view display to an automotive vehicle with the first polymer film oriented toward an interior of the vehicle and the second polymer film oriented toward an exterior of the vehicle;

providing a first ultraviolet energy source;

providing a second ultraviolet energy source;

generating a first pattern by emission of energy from the first source to a portion of the first polymer film; and generating a second pattern by emission of energy from the second source to a portion of the second polymer film.

10. The method of claim 9, wherein the second pattern is distinct from the first pattern.

11. The method of claim 9, wherein the plurality of laminated layers includes a first rigid layer disposed on a first side of the first polymer film and a second rigid layer on a second side of the second polymer film.

12. The method of claim 9, wherein the first polymer film includes a first layer for emission of a first color of the visible spectrum and a second layer for emission of a second color of the visible spectrum.

* * * * *